Dec. 24, 1957 H. E. HOLLMANN 2,817,761

TRANSISTOR OSCILLATOR CIRCUITS

Filed Sept. 28, 1954

INVENTOR
HANS E. HOLLMANN

BY [signatures]

ATTORNEYS 2,817,761

TRANSISTOR OSCILLATOR CIRCUITS

Hans E. Hollmann, Sherman Oaks, Calif.

Application September 28, 1954, Serial No. 458,993

5 Claims. (Cl. 250—36)

Figure 1:
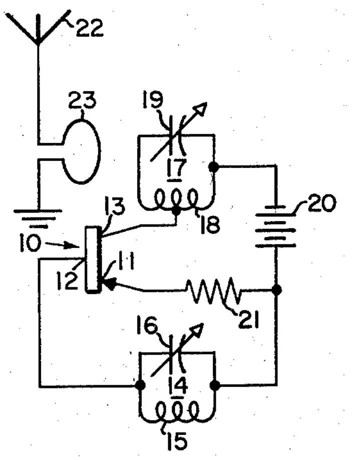

(Granted under Title 35, U. S. Code (1952), sec. 266)

The invention described herein may be manufactured and used by or for the Government of the United States of America for governmental purposes without the payment of any royalties thereon or therefor.

The invention is especially designed for the generation of very high frequencies and microwaves with transistors. In prior art oscillator circuits, the alpha cutoff frequency caused by the transistor capacities and the transit time effects of the charge carriers as they migrate through the semi-conductor limits the frequency range to the vicinity of approximately one-hundred megacycles. The only way to exceed this frequency without the use of vacuum tubes is with the aid of passive frequency multiplication, e. g. by means of a cascade multiplier in the form of crystal diodes. Optimum efficiency of such a passive frequency multiplier requires interstage coupling by means of resonance circuits the frequency of which increases in accordance with the arrangement of the diodes and which may operate as frequency doublers or triplers. The oscillatory energy in such a linear frequency multiplier decreases considerably as the frequency increases. In addition, a frequency multiplier cascade requires careful and delicate tuning of the successive resonators and makes any change of frequency extremely complicated.

The present invention provides an oscillatory circuit which employs a plurality of resonance circuits or equivalent resonators each of which is connected to one of the transistor electrodes in such a way that all the resonators are included in the closed feedback loop. The frequency of one of the resonators is substantially higher than that of another so that said one resonator selects a very high harmonic of the fundamental frequency. According to the invention, circular frequency multiplication occurs as the oscillations build up along the feedback loop whereby the oscillatory transistor takes the place of the successive diodes in a linear multiplier cascade, and wherein the various resonators which are the nonlinear transistor impedances exhibit periodically varying parameters and multiple resonances which take the place of the indivdual tank circuits in a linear multiplier. In other words, the oscillatory circuit for circular frequency multiplication as provided in the present invention acts as a linear frequency multiplier cascade wound around a single transistor thus producing harmonics of increasing order and at the same time produces the phenomenon of multiple resonances so that a few resonators replace the multiplicity of resonators in a conventional multistage multiplier cascade. In circuits according to the invention, no extra multiplier elements and devices are necessary thereby simplifying the circuitry as well as the tuning to a great extent.

An object of the invention is the provision of a new and novel transistor oscillator which is adapted to produce harmonics of very high order far above the alpha cutoff frequency.

Another object is to provide a transistor oscillator circuit for frequency multiplication which requires no extra multiplier elements or devices.

A further object of the invention is the provision of a transistor oscillator circuit for the generation of very high frequencies and microwaves which is simple and inexpensive in construction, yet efficient and reliable in operation.

Figure 3:
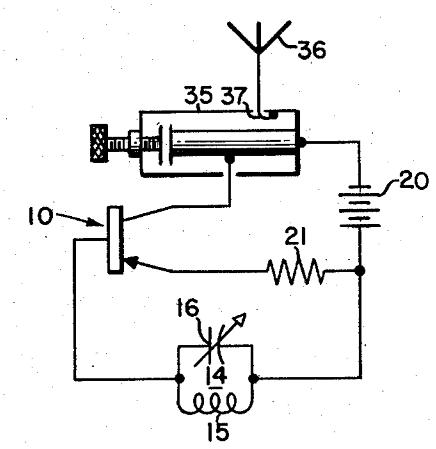
Figure 4:
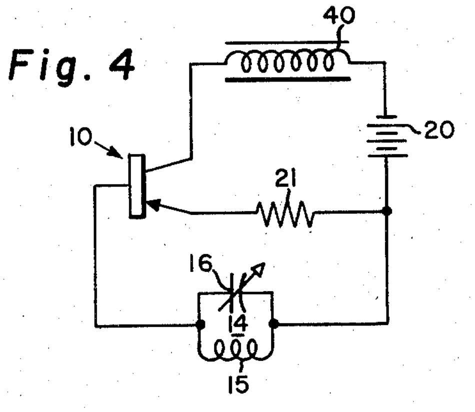
Figure 2:
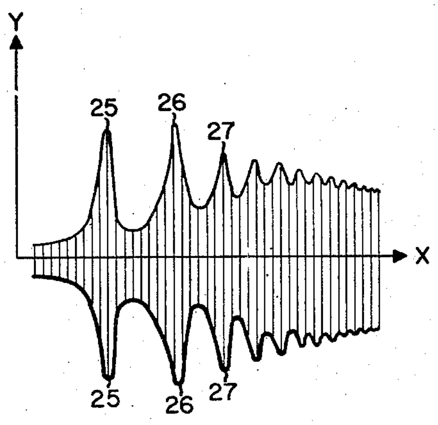

Other objects and many of the attendant advantages of this invention will be readily appreciated as the same becomes better understood by reference to the following detailed description when considered in connection with the accompanying drawings wherein:

Fig. 1 is a schematic diagram of an oscillator circuit according to the invention, Fig. 2 is an oscillogram which demonstrates the phenomenon of multiple resonances, Fig. 3 shows a modification of the invention, and Fig. 4 illustrates another modification of the invention.

Referring now to the drawings wherein like reference characters designate like corresponding parts throughout the several views, there is shown in Fig. 1 a transistor 10 having an emitter 11, a base 12, and a collector 13. A first tank circuit 14 is connected between emitter 11 and base 12 and includes a coil 15 and an adjustable capacitor 16. A second tank circuit 17 including a coil 18, and an adjustable capacitor 19 is inserted in the collector circuit in series with the power supply 20 illustrated in the form of a battery. The necessary emitter voltage is produced across the resistor 21 in the emitter circuit.

In analogy to a tuned-grid tuned-plate vacuum tube transmitter, the oscillator is of the tuned-base tuned-collector type and regenerative feedback occurs via the transistor impedances. The radio-frequency output energy is induced in the tank circuit 17 and is radiated by the antenna 22 which is coupled with the collector tank circuit 17 by means of a coupling loop 23. The transmitter may be modulated in amplitude or frequency by means of conventional modulators. Furthermore, the oscillator frequency may be stabilized with the aid of a quartz resonator which, e. g. may be connected across the emitter resistance 21.

According to the philosophy of tuned-grid tuned-plate vacuum tube oscillators, self-excitation requires both tank circuits 14 and 17 to be very close to resonance, or in other words, both tank circuits 14 and 17 must exhibit the same frequency $f_0$. Transistor oscillators, however, operate on a broader basis because the transistor is more nonlinear than a vacuum tube and, at the same time, the nonlinear transistor impedances shunt both tank circuits and provide them with periodically-varying parameters.

Due to both effects, the exact philosophy and complete analysis of transistor oscillators according to the invention is extremely complicated. The performance of the tank circuits paralleled by the nonlinear transistor impedances is fully described by differential equations of the Mathieus's and Hill's type. Instead of discussing the stable and unstable steady-state solutions, a simplified philosophy may suffice for the explanation of the circular frequency multiplication according to the invention. For this purpose, the tank circuit 14 is considered to be shunted by the nonlinear base resistance of the transistor which, under the influence of the oscillatory voltage, varies periodically with the oscillatory frequency $f_0$. The result is an amplitude-modulation which manifests itself in the form of sidebands. In contrast to conventional amplitude modulation, however, the quality factor of the tank circuit 14 is modulated by the periodically-varying base resistance with the frequency $f_0$ itself so that the side-bands occur at intervals $f_0$. Finally, this amplitude modulation with the oscillatory frequency $f_0$ results in multiple resonances so that the tank circuit 14 exhibits a large spectrum of harmonics.

Since the multiple-resonance phenomenon in conjunction with the nonlinear operation of the transistor acting as an energy converter is the prerequisite for an efficient circular frequency multiplication, it may be illustrated by the experimental frequency spectrum portrayed in Fig. 2. The spectrum was taken by means of an oscilloscope whose Y-deflection indicates the radio frequency voltage induced in the tank circuit 14 by means of a signal generator whose frequency was varied proportionally to the X-deflection whereby the transistor parameters were adjusted below the region of self-excitation. The first resonance maximum 25 indicates the conventional resonance of the fundamental frequency $f_0$ characterized by the order $n$ equal to one. As the driving frequency increases, a series of additional resonance peaks 26, 27 occurs which indicate well pronounced harmonics with increasing orders $n$. It is important to note that the amplitude of the second harmonic is a little greater than that of the fundamental oscillation which indicates a slight frequency modulation accompanying the explained amplitude modulation and which is caused by the periodically-varying base reactance. Moreover, the oscillogram shows only a slight decrease of the quality factors of the multiple resonances not encountered in vacuum tube oscillators. Furthermore, it must be pointed out that the phenomenon of the multiple resonances is caused by a single transistor impedance, or more specifically by the base diode without being limited by the alpha cutoff frequency.

With the picture of the multiple resonances in mind, the phenomenon of circular frequency multiplication can easily be understood as it occurs in the oscillator circuit portrayed in Fig. 1. The oscillator operates at the fundamental frequency $f_0$ but, since the tank circuit 14 presents a high quality factor for the entire spectrum of harmonics, the feedback loop is effective for high orders of $n$ so that the collector tank circuit 17 can be tuned to frequencies $nf_0$ very much higher than the fundamental value $f_0$. Since $f_0$ can be brought up to the vicinity of the alpha cutoff value, the transistor, according to the invention, is capable of producing powerful harmonics far above its alpha cutoff frequency. Experiments have shown that harmonics as high as the 12th order can be obtained with a useful amount of energy. For example, a commercially available point contact transistor having an alpha cutoff frequency of 50 megacycles may generate a fundamental frequency $f_0$ of 50 megacycles and, according to the invention, produce an output frequency as high as 600 megacycles.

Fig. 3 illustrates a modification of the device wherein the tank circuit 17 in Fig. 1 is replaced by a cavity resonator 35. In this manner, the transistor oscillator operates successfully up to the V. H. F. region. The antenna 36 is coupled to the resonator by means of coupling loop 37 and radiates the generated harmonic frequency.

For higher output frequencies up to the microwave region, the output resonator may be a typical microwave resonator. For example, the circuit shown in Fig. 4 contains a resonating helix 40 which is tuned to the frequency $nf_0$ and, at the same time, acts as a choke for the fundamental frequency $f_0$.

The tank circuit 17, the cavity resonator 35, and the helix 40 are considered to be equivalent electrical elements for the purpose of the present invention, and any combination of these elements may be employed to serve as resonators in the invention circuits.

It is apparent from the foregoing that there is provided new and novel transistor oscillator circuits which produce harmonics of very high order far above the alpha cutoff frequency of the transistor and which require no extra multiplier elements or devices.

Obviously many modifications and variations of the present invention are possible in the light of the above teachings. It is therefore to be understood that within the scope of the appended claims the invention may be practiced otherwise than as specifically described.

I claim:

1. A transistor oscillator circuit which comprises a transistor exhibiting non-linear transfer characteristics in response to a periodically-varying applied voltage, said transistor having emitter, collector and base electrodes, a first resonator connected between two input transistor electrodes, a second resonator connected between two output transistor electrodes, and a source of power connected in the output circuit of said transistor, the resonant frequency of said second resonator being substantially higher than the resonant frequency of said first resonator, whereby a portion of the oscillatory energy developed by said second resonator is fed back in nonlinear fashion through said transistor to the input circuit thereof.

2. A transistor oscillator circuit as defined in claim 1 wherein said first resonator is connected between said base electrode and said emitter electrode and said second resonator is connected between said collector electrode and said emitter electrode.

3. A frequency-multiplier comprising a transistor exhibiting a non-linear transfer characteristic to a periodically-varying applied voltage, said transistor having emitter, collector, and base electrodes; a first resonator tuned to frequency $f_0$ connected between two of the electrodes of said transistor; a second resonator, tuned to a harmonic of frequency $f_0$, connected between the remaining electrode of said transistor and one of the electrodes to which said first resonator is connected; whereby self-sustained oscillations will be developed due to the feedback of periodically-varying energy from said second resonator to said first resonator in a non-linear manner through said transistor.

4. A frequency-multiplier according to claim 3, in which at least one of said resonators comprises a tuned L-C network.

5. A frequency-multiplier circuit which comprises a transistor having emitter, collector, and base electrodes; a resistive impedance; a source of power; a first parallel L-C network; means connecting said resistive impedance, said source of power, and at least a portion of said first parallel L-C network in series in the base circuit of said transistor; and a second parallel L-C network connected in series with said resistive impedance in the collector circuit of said transistor, said second L-C network being resonant at a frequency which is substantially a harmonic of the frequency at which said first L-C network is resonant; whereby said frequency-multiplier circuit will produce self-sustained oscillations due to feedback of energy from the said collector circuit to the said base circuit through said transistor.

References Cited in the file of this patent

UNITED STATES PATENTS

| | | |
|---|---|---|
| 1,571,278 | Kuhn | Feb. 2, 1926 |
| 2,245,597 | Lindenblad | June 17, 1941 |
| 2,352,455 | Summerhayes | June 27, 1944 |
| 2,367,576 | Harvey et al. | Jan. 16, 1945 |
| 2,545,985 | Baker | Mar. 20, 1951 |

OTHER REFERENCES

Article: "Transistor Oscillator With Crystal Control," by Rhita, page 56 of Radio Electronics, for April 1952.

Article: Junction Transistor Equivalent Circuits and Vacuum Tube Analogy, pages 1490–1493 of Proc. I. R. E., vol. 40, No. 11, for November 1952, by Giacoletto.

Article: "50 mc. Oscillator," page 204 of Electronics, for September 1953.